(12) United States Patent
Usoskin (10) Patent No.: US 8,802,598 B2
(45) Date of Patent: Aug. 12, 2014

(54) SUPERCONDUCTING ELEMENT WITH ELONGATED OPENING AND METHOD FOR MANUFACTURING A SUPERCONDUCTING ELEMENT

(75) Inventor: Alexander Usoskin, Hanau (DE)

(73) Assignee: Bruker HTS GmbH, Hanau (DE)

( * ) Notice: Subject to any disclaimer, the term of this patent is extended or adjusted under 35 U.S.C. 154(b) by 116 days.

(21) Appl. No.: 13/396,612

(22) Filed: Feb. 15, 2012

(65) Prior Publication Data

US 2012/0214673 A1 Aug. 23, 2012

(30) Foreign Application Priority Data

Feb. 18, 2011 (EP) .................................... 11154949

(51) Int. Cl.
*H01L 39/24* (2006.01)
(52) U.S. Cl.
USPC .......................................... 505/237; 505/238
(58) Field of Classification Search
USPC .................. 505/211, 230, 237, 238
See application file for complete search history.

(56) References Cited

U.S. PATENT DOCUMENTS

| | | | | |
|---|---|---|---|---|
| 7,774,035 B2 * | 8/2010 | Lee et al. | ....................... | 505/231 |
| 7,829,156 B2 | 11/2010 | Usoskin | | |
| 2007/0197395 A1 | 8/2007 | Kodenkandath | | |
| 2008/0113870 A1 | 5/2008 | Lee | | |

FOREIGN PATENT DOCUMENTS

WO   WO 2007/004787   *   1/2007

OTHER PUBLICATIONS

Janos Kosa et al., "Fault current limiter with novel arrangement of perfect YBCO loops made of HTS wire", 14th International Power Electronics and Motion Control Conference (EPE/PEMC 2010), Sep. 6-8, 2010, Ohrid, Macedonia, Sep. 6, 2010, pp. T10/69-T10/73.
"SuperPower 2G HTS Wire Specification" Aug. 31, 2009, pp. 1-4, Retrieved from the Internet: URL:http://www.superpower-inc.com/system/files/SP_26+Wire+Spec+Sheet_for+web_509.pdf.

* cited by examiner

*Primary Examiner* — Colleen Dunn
(74) *Attorney, Agent, or Firm* — Paul Vincent (57) ABSTRACT

A superconducting element (SE1-SE5) with a central section (20) located between two end sections (21a, 21b) of the superconducting element (SE1-SE5), the superconducting element (SE1-SE5) has a substrate tape (10), a buffer layer (11), a high temperature superconducting (HTS) layer (12), a first protection layer (14), and a shunt layer (17), The superconducting element (SE1-SE5) has at least one elongated opening (19) in the central section (20) elongated between the two end sections (21a, 21b), whereby the at least one elongated opening (19) divides the central section (20) of the superconducting element (SE1-SE5) into at least two HTS strips (18a, 18b, 18c), whereby the shunt layer (17) envelops the surface of each of the HTS strips (18a, 18b, 18c). The superconducting element shows improved electrical stabilization and time stability.

18 Claims, 6 Drawing Sheets

SUPERCONDUCTING ELEMENT WITH ELONGATED OPENING AND METHOD FOR MANUFACTURING A SUPERCONDUCTING ELEMENT

This application claims Paris Convention priority of EP 11 154 949.9 filed Feb. 18, 2011 the complete disclosure of which is hereby incorporated by reference.

BACKGROUND OF THE INVENTION

The invention relates to a superconducting element with a central section located between two end sections of the superconducting element, the superconducting element comprising: a substrate tape, a buffer layer, a high temperature superconducting (HTS) layer, a first protection layer, and a shunt layer.

A layered HTS structure, comprising a substrate, a buffer layer, an HTS layer, a capping layer and a stabilizer layer, or a corresponding method for its manufacturing, respectively, is known from U.S. Pat. No. 7,774,035 B2.

The invention deals with high temperature superconducting coated tapes and may be employed, in particular, in the fields of building of magnets, rotating machines, machines and devices for energy storage, energy transmission, and energy distribution.

Superconductors are used when large electric currents shall be transported or applied with low ohmic losses. High temperature superconductors, having a critical temperature high enough such that cooling may be done with liquid nitrogen (boiling point at atmospheric pressure about 77K), are inexpensive in cooling. However, due to their thin film nature combined with their ceramic properties, HTS conductors and elements are usually manufactured on substrates (HTS coated conductors); in particular, there are tape type substrates that typically offer some mechanical flexibility to HTS coated conductors. For HTS coated tapes, it is known to deposit the HTS film on a buffer layer deposited on the substrate, in order to achieve a beneficial HTS grain orientation needed for high critical currents. The HTS film is typically covered by a protection layer (also called capping layer) of a noble metal in order to avoid chemical reaction with aggressive environmental compositions (as e.g. acids, salt water, . . . ), and a shunt layer (also called stabilization layer) is deposited on top. The shunt layer shall ensure protection against high current overloads (electrical stabilization), e.g. in case of a quench.

In applications, the HTS coated conductors are usually electrically connected one to other in order to provide a functional device or element to be employed in e.g. magnet, cable, motor, fault current limiter.

However, the time stability of superconducting elements being composed or formed from HTS coated tapes is not sufficient enough which is due to reduction of critical current and deterioration of mechanical parameters, e.g. of critical bending radius. Especially this is valid in superconducting elements that undergo electrical quench or are exploited in conditions where minimization of Joel's losses are important.

It is an object of the invention to provide a superconductive element with improved electrical stabilization and time stability and a method for manufacturing such a superconducting element. Further object is to suppress Joel's losses in the superconducting element.

SUMMARY OF THE INVENTION

This object is achieved, in accordance with the invention, by a superconducting element and a method according to the independent claims.

The inventive superconducting element comprises at least one elongated opening in the central section, the opening being elongated between the two end sections, whereby the at least one elongated opening divides the central section of the superconducting element into at least two HTS strips. The shunt layer envelops the surface of each of the HTS strips.

The opening defines a current path through the metallic substrate, in particular the path for fault current that appears when the HTS film is quenched under current that exceeds a critical threshold. Thereby less chemical diffusion is activated by both current transport and a bit higher temperature. In ac case the opening results in additional reduction of loss due to less width of particular parts of the superconducting element. Thus by providing the inventive elongated opening time stability of the superconducting element can be improved. An additional advantage is the equalization of currents. They become not dependent on transient resistances. Especially in case when a circular (eddy) current is generated within the superconducting element, the opening leads to reduction of Joel's losses (dc and ac).

The opening can be produced by a cutting process.

The two end sections joint the HTS strips, thereby forming an "uninterrupted" superconducting electrical circuit with low Joel's losses. The elongated opening may be a slot with width in the range of 1-500 µm, preferably 30-100 µm. In a partially prepared state of the superconducting element (coated substrate without shunt layer) the opening exposes inner edge surfaces of the layered structure of the partially prepared coated tape, which face each other. Said inner edge surfaces will be referred to as "edge surfaces of the opening".

The shunt layer is conductive, preferably metallic, and envelops the surface of each of the HTS strips, i.e. the shunt layer covers the whole surface of the HTS strips including the bottom surface and the top surface of the HTS strip as well as the edge surfaces of the opening.

The inventive enveloping shunt layer provides a considerably more effective electrical stabilization (higher threshold of deterioration) compared to the a known superconducting element, especially in case of an electrical quench, since the inventive shunt layer provides electrical stabilization in two directions: (i) along the elongation of the HTS strips and (ii) in perpendicular direction (along the circumference of the HTS strips), i.e. for "circumferential" currents.

Further the inventive shunt layer effects better "encapsulation" of the HTS layer and buffer layer. I.e. the shunt layer protects the superconducting element against penetration of coolant ($LHe_2$) or water or other liquids or vapors that may cause deterioration of the superconducting element. Therewith longer lifetime and better operational stability can be realized.

For reasons of lower costs the substrate is preferably metallic, in particular it can be made of Cr—Ni stainless steel, typically sheeted to a width in the mm range or sub-mm range (preferably 2 mm-100 mm), thus offering some mechanical flexibility. The tape is, in general, much longer than wide (typically by a factor of at least 10; note that the production may be based on "endless" tape), and much wider than thick (typically by a factor of at least 10).

The superconducting element is preferably elongated. The elongated opening is advantageously provided in a longitudinal direction of the elongated superconducting element, i.e. the opening is elongated along the longer axis of superconducting element. This is advantageous e.g. for Low voltage iSFCL (inductive superconducting fault current limiter with operating voltage of 10-20 kV). Yet, for special applications, e.g. in iSFCL used for >100 kV, it is also possible to orient the elongated opening in a transversal direction of the elongated superconducting element, i.e. the opening is elongated along the shorter axis of superconducting element. In case of a rectangular superconducting element the shorter axis is perpendicular to the longer axis.

In order to suppress concentration of stress at the end of the opening the width of the elongated opening is preferably increased in a dilated area near to the end sections of the superconducting element. Thereby mechanical stability and lifetime of the superconducting element can be increased.

In a preferred embodiment of the inventive superconducting element the length of the end section in longitudinal direction of the elongated opening exceeds the minimal width of each of the at least two HTS strips, in particular the length of the end sections exceeds the widths of the superconducting element. The longitudinal direction is the direction parallel to the major extension of the opening. The term "minimal width of the HTS-strip" does not include the width near the dilated area of the opening.

By providing a length of the end sections that exceeds the width of the HTS strips a sufficient length of the end sections is ensured which allows to equalize superconducting currents when they flow in the same direction in different strips or to reduce Joel's losses in the areas of reversion of the current where self field becomes much more stronger. Moreover, sufficient length of the end section allows potentially jointing of several superconducting elements by connecting the end section of a first superconducting element to the end section of a second superconducting element in a persistent manner.

Further preferred is an embodiment in which a ratio R of a thickness $T_{sub}$ of the substrate and a width $W_{op}$ of the elongated opening is in the range of R=0.5 to R=80. In this parameter range of $R=T_{sub}/W_{op}$, the critical current losses upon cutting have been found to be particularly low.

The shunt layer advantageously comprises a basic conductive layer and a second protection layer, whereby the second protection layer is provided between the first protection layer and the basic conductive layer. The second protection layer is preferably metallic. By providing a second protection layer, the superconducting element comprises a protection layer which is deposited in two steps (deposition of the first protection layer and deposition of the second protection layer, together forming the protection layer), whereby the cutting (e.g. laser beam cutting) is performed between the deposition of the first and the second protection layer. By this procedure, the HTS layer (which is deposited below the first protection layer) is already protected against reactive environment by the first protection layer when the cutting is started (which typically comes along with aggressive/reactive environment for the entire partially prepared coated tape). In turn, the "fresh" edges resulting from the cutting process (edge surfaces of the opening) will still be protected by the second protection layer deposited after the cutting and prior to the deposition of the basic conductive layer of the shunt layer. The deposition of the second conductive layer is advantageous if the materials of the substrate tape and the basic conductive layer only poorly adhere to each other (e.g. a Cu basic conductive layer and a stainless steel substrate). For very special combination of materials and deposition method for the shunt layer, the second protection layer may be omitted (i.e. the shunt layer only consists of the basic conductive layer). Yet, the two-layered structure of the shunt layer causes better electrical performance (higher critical currents) and better time stability of the superconducting element being in direct contact with a liquid or gaseous coolant.

The basic conductive layer is typically made of a non-noble metal, in particular copper, nickel or their alloys, often containing impurities, both of which may be reactive; in some cases basic conductive layers made of noble matalls, e.g. silver or gold, or the like may be used. The deposition of the basic conductive layer may comprise galvanic plating. This process is particularly simple and allows full coverage of the partially prepared coated tape without further measures.

The second protection layer advantageously covers at least partially the first protection layer and the edge surfaces (edge surfaces of the opening as well as outer edge surfaces if not covered by the first protection layer) of the underlying layers. By covering the edge surfaces of the underlying layers the penetration of aggressive chemicals (acids, water, . . . ) into the superconducting element structure can be avoided.

In order to provide better stability and longer lifetime of the inventive superconducting element the second protection layer taken together with the first protection layer preferably envelops all surfaces of the superconducting element which is available before deposition of the basic conductive layer. I.e. the entity of the first and the second protection layer surrounds the partially prepared coated tape, including the substrate tape with buffer layer and HTS layer).

The second protection layer (as well as the first protection layer) preferably comprises noble metals, copper or their alloys. It can be deposited via vacuum deposition. This grants a high quality deposition, in particular low in impurities. The thickness of the protection layer is preferably from 0.03 to 2 µm.

In an advantageous embodiment the buffer layer comprises at least two different sub-layers, thereby providing an improved template for HTS layer growth and/or a diffusion barrier. Further mismatch in crystalline lattice parameters can be compensated. The sub-layers are preferably dielectric. The first sub-layer is preferably made of materials with a chemical barrier, the capability to serve as a crystalline template and a moderate mismatch of lattice parameters with the HTS layer. It may be based on yttria stabilized zirconia (YSZ) (with a preferred thickness of 0.3-3 µm, in particular ca. 1.5 µm) which is bi-axially textured via alternating beam assisted deposition (ABAD) (compare EP 1 693 905 B1 for details), and a so called cap layer may comprise $CeO_2$ (second sub-layer) with a preferred thickness of 0.01 to 1 µm, in particular about 0.1 µm. ABAD produces a textured template for appropriate growth of the HTS layer. It is also possible to deposit a planarization sub-layer made of aluminia ($Al_2O_3$) prior to YSZ and $CeO_2$ sub-layers. Other suitable first sub-layer materials are e.g. MgO, gadolinium zirconate, titan nitride, cerium oxide. The cap layer can also be made of Barium zirconate and plenty of other materials which show a small mismatch of lattice parameters with the HTS layer.

The HTS-layer preferably comprises a high temperature superconductor as $ReBa_2Cu_3O_{7-x}$ or their mixtures, where Re denotes a rare earth element. The HTS layer (HTS-film) is preferably based on $YBa_2Cu_3O_{7-x}$, with a preferred thickness of 0.1 to 10 µm, in particular about 1.5 µm. The second buffer sublayer and the HTS layer are preferably processed via pulsed laser deposition.

In a highly preferred embodiment the end sections comprise a protector for limiting bending and torsion of the at least two strips. Thereby bending and torsion of the superconducting element can be limited in the range which avoids deterioration of a critical current in the at least two HTS strips. The protector is typically made of a non-magnetic metal, preferably Cu, stainless steel, or silver. The protector can be fixed to the superconducting element (preferably in the very end of the superconducting element) via mechanical coupling (as e.g. clamping) with edge areas of the strips or via glue bonding. Alternatively, the end sections of the superconducting element can be simply inserted in the protector.

The protector preferably projects above the end sections of the superconducting element in their longitudinal direction.

In a special embodiment of the inventive superconducting element the HTS-strips are mechanically deformed, in particular twisted and/or bended. This is advantageous when the initial tape width is small (say 4 mm). In this case the cutting before deposition of the shunt layer is made very thin, 50 μm for example, in order not to lose current. On the other hand the thickness of the basic conductive layer may be equal to 50 μm or even more. By deforming the HTS strips a non-flat superconducting element can be formed and mechanical contact between the HTS-strips can be prevented.

The invention also concerns a superconducting coil which comprises an inventive superconducting element.

Further the invention concerns a method for manufacturing a superconducting element, the method comprising the following steps:
- a providing a substrate tape,
- b depositing a buffer layer onto the substrate tape,
- c depositing a HTS layer onto the buffer layer,
- d depositing a first protection layer onto the HTS layer and
- e depositing a shunt layer.

The substrate tape which is at least coated with a buffer sub-layer, but is not coated with a shunt layer is referred to as a "partially prepared coated tape". According to the invention a cutting of the partially prepared coated tape is performed prior to the deposition of the shunt layer thereby dividing a central part of the partially prepared coated tape into at least two HTS-strips. Thereby spreading of damages from the immediate cutting zone during cutting can be reduced. The shunt layer is deposited onto all surfaces of each of the HTS-strips of the partially prepared coated tape. Thus an inventive superconducting element can be produced.

The cutting is preferably performed by laser beam cutting which is applied together with a gas flow and/or a liquid flow directed along the laser beam. Yet, it is also possible to perform a water-jet cutting or an electron-beam cutting.

The cutting may be performed prior to deposition of the second protection layer, preferably after deposition of the first protection layer 14. Cutting can also be carried out in an earlier stage of production, as long as the deposition of at least one sub-layer of the buffer layer 11 has been carried out.

Advantageously the HTS strips are tilted relative to each other or defomed during deposition of the shunt layer, thereby keeping the partially prepared coated tape in a non-flat form.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

BRIEF DESCRIPTION OF THE DRAWING

FIG. 3b shows schematically a side view of the superconducting element shown in FIG. 3a.

FIG. 4b shows schematically a side view of the superconducting element shown in FIG. 4a.

FIG. 5b shows schematically a transversal crossectional view of the superconducting element shown in FIG. 5a.

FIG. 6b shows schematically a side view of the superconducting element shown in FIG. 6a.

DESCRIPTION OF THE PREFERRED EMBODIMENT

Figure 1A:
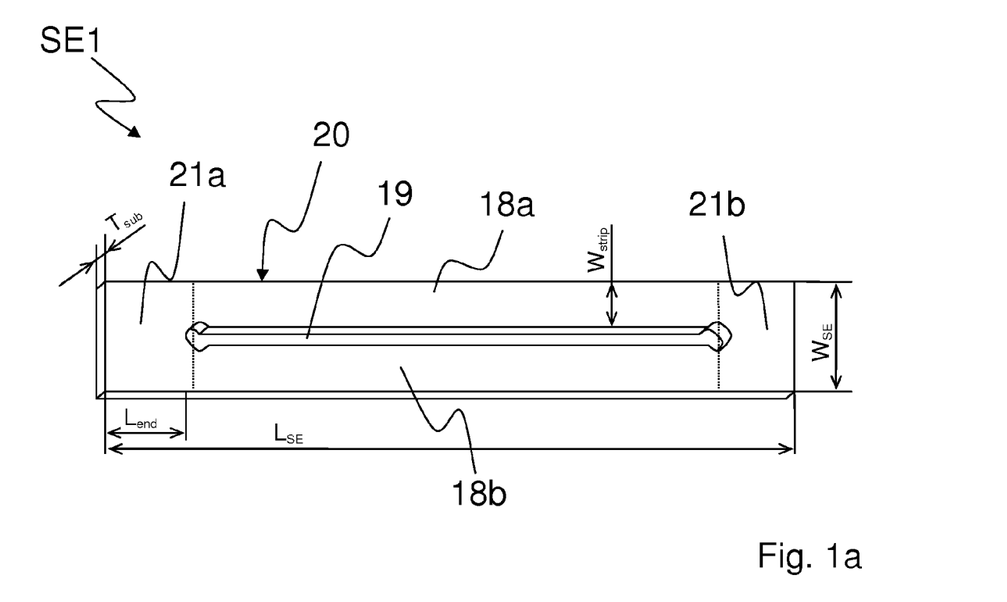
FIG. 1a shows schematically an inventive superconducting element with an elongated opening.

FIG. 1a shows an inventive superconducting element SE1 with an elongated opening 19 in the form of a slot. The superconducting element SE1 comprises a central section 20, which is adjacent to two end sections 21a, 21b (in FIG. 1a the boundary of the central section 20 to the end sections 21a, 21b is shown by a dashed line). The end sections 21a, 21b may have a length $L_{end}$ of several widths $W_{SE}$ of the superconducting element SE1. The elongated opening 19 is positioned in the central section 20 of the superconducting element SE1. The ends of the elongated opening 19 are adjacent to the end sections 21a, 21b of the superconducting element SE1. The opening 19 divides the central section 20 into two HTS strips 18a, 18b. The end sections 21a, 21b connect the HTS strips 18a, 18b thereby forming a closed loop that surrounds the opening 19.

Figure 1B:
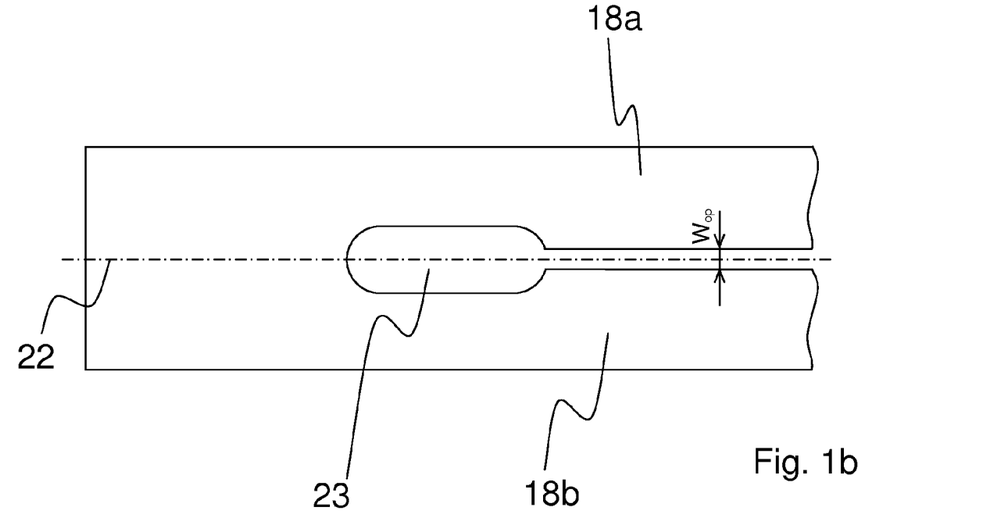
FIG. 1b shows schematically a detailed partial view of the superconducting element shown in FIG. 1b.

As shown in FIG. 1b the elongated opening 19 is oriented along a longitudinal axis 22 of the superconducting element SE1 and comprises a minimal width $W_{op}$. In dilated areas 23 at both ends of the opening 19, the width of the opening 19 is increased in order to suppress concentration of stress in the end of the opening 19, thereby increasing mechanical stability and lifetime of the superconducting element SE1.

Figure 2A:
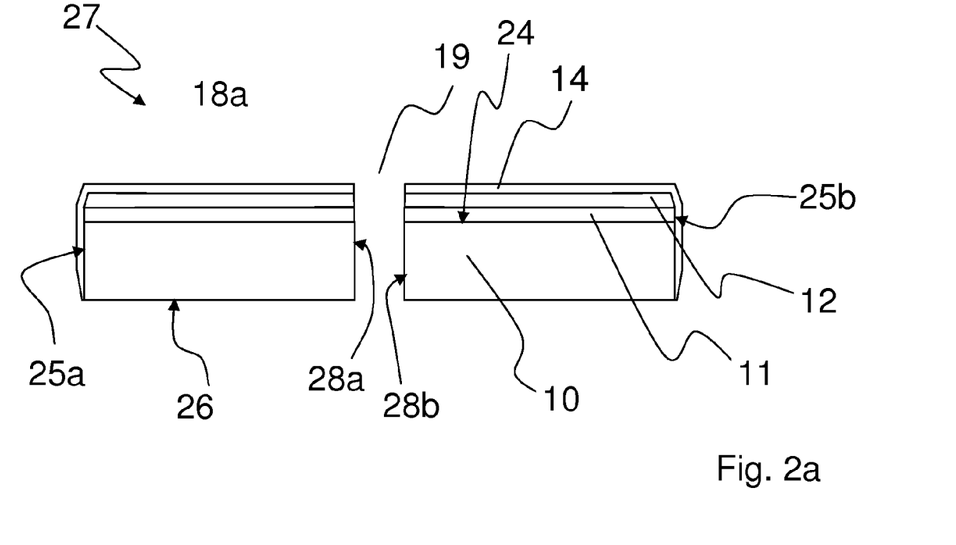
FIG. 2 shows schematically a transversal crossectional view of an inventive superconducting element, exposing the layer sequence.
Figure 2B:
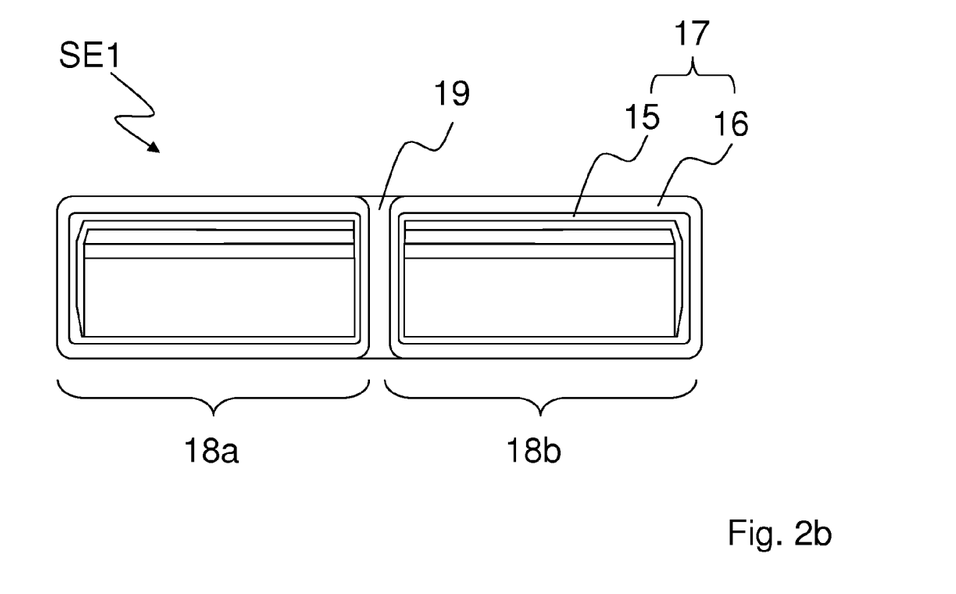

A cross sectional view of a partially prepared coated tape 27 is shown in FIG. 2a and of an inventive superconducting element SE1 in FIG. 2b.

On a substrate tape 10, a buffer layer 11 (which may comprise several buffer sub-layers) is deposited. On top of the buffer layer 11, a HTS layer 12 is deposited. Further, a first metallic protection layer 14 is deposited on top of the HTS layer 12. Whereas the buffer layer 11 and the HTS layer 12 are deposited onto the top surface 24 of the substrate 10 and the buffer layer respectively, the first protection layer 14 also covers outer edge surfaces 25a, 25b (of the substrate 10 with deposited buffer layer 11 and HTS-layer 12). Thus, penetration of aggressive chemicals (acids, water . . . ) into the superconducting element structure can be prevented. The first protection layer 14 may also cover the bottom side 26 of the substrate 10 in order to provide better stability and longer lifetime of the superconducting element SE1 (not shown).

The thickness of the protection layer 14 may be inhomogeneous, especially in the vicinity of the outer edge surfaces 25a, 25b. Each layer 11, 12, 14 may be smoothed in the vicinity of the outer edge surfaces 25a, 25b, which is shown for the HTS-layer 12 and the protection layer 14 in FIG. 2a.

Thereby mechanical and electrical peculiarities can be suppressed at the corners of cross-section. Further time stability is improved.

The opening 19, which is provided by a cutting process, extends through the substrate and all deposited layers (11, 12, 14) of the partially prepared coated tape 27, thereby exposing inner edge surfaces 28a, 28b of the opening 19. FIG. 2b shows that a second protection layer 15 is deposited from every side ("around") onto the (here two) HTS-strips 18a, 18b of the partially prepared coated tape 27, including outer edge surfaces 25a, 25b, inner edge surfaces 28a, 28b, top surface and bottom surface of the HTS-strips 18a, 18b of the partially prepared coated tape 27. As a result, the second protection layer 15 completely covers (envelops) the HTS-strips 18a, 18b in contrast to the first protection layer 14 which does not cover the inner surfaces 28a, 28b of the elongated opening 19 and the bottom surface 26 of the substrate 10. Subsequently, a basic conductive layer 16 is deposited, also completely covering the HTS-strips 18a, 18b from every side. The second protection layer 15 and the basic conductive layer 16 form a shunt layer 17.

Figure 3A:
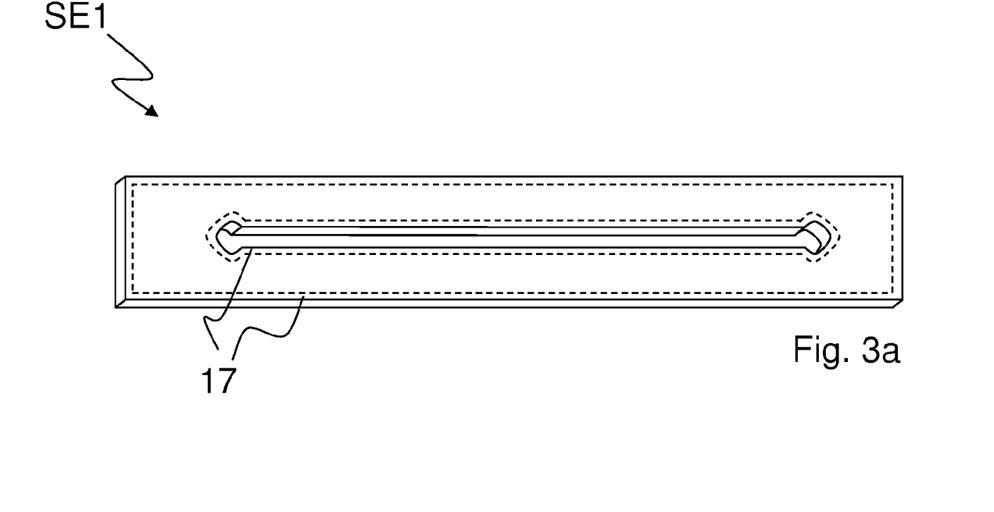
FIG. 3a shows schematically an inventive superconducting element with shunt layer enveloping a partially prepared HTS coated tape.
Figure 3B:
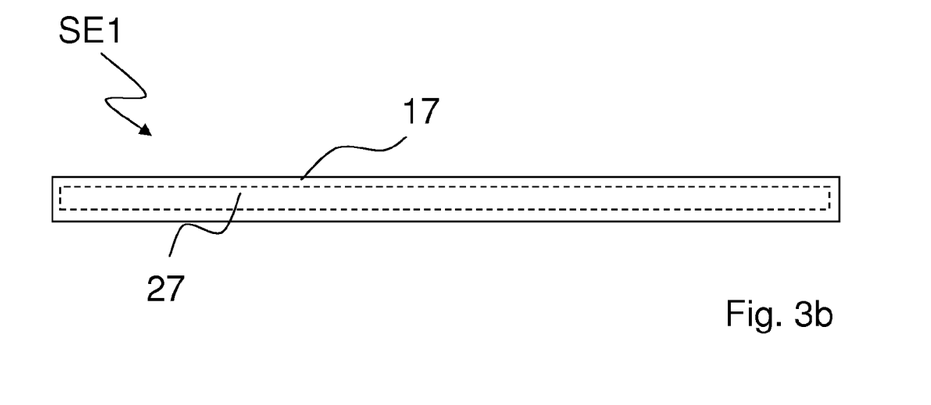

FIG. 3a, 3b show the partially prepared coated tape 27 (dashed line) which is enveloped by the shunt layer 17.

The thicknesses of the second protection layer 15 and of the basic conductive layer 16 may be inhomogeneous, especially in the outer edge surfaces 25a, 25b of the superconducting element SE1 and in the edge surfaces 28a, 28b of the elongated opening 19.

Figure 4A:
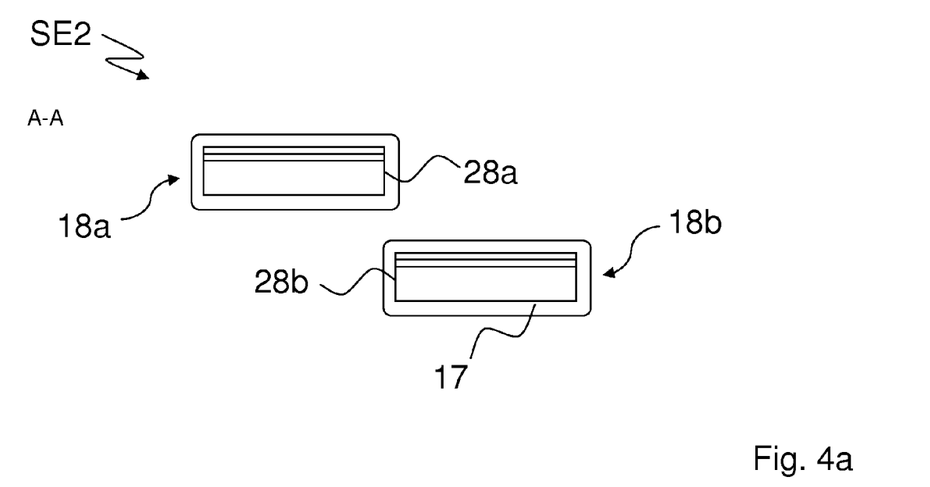
FIG. 4a shows schematically a transversal crossectional view in plane A-A of an inventive superconducting element with narrow opening and deformed HTS-strips.
Figure 4B:
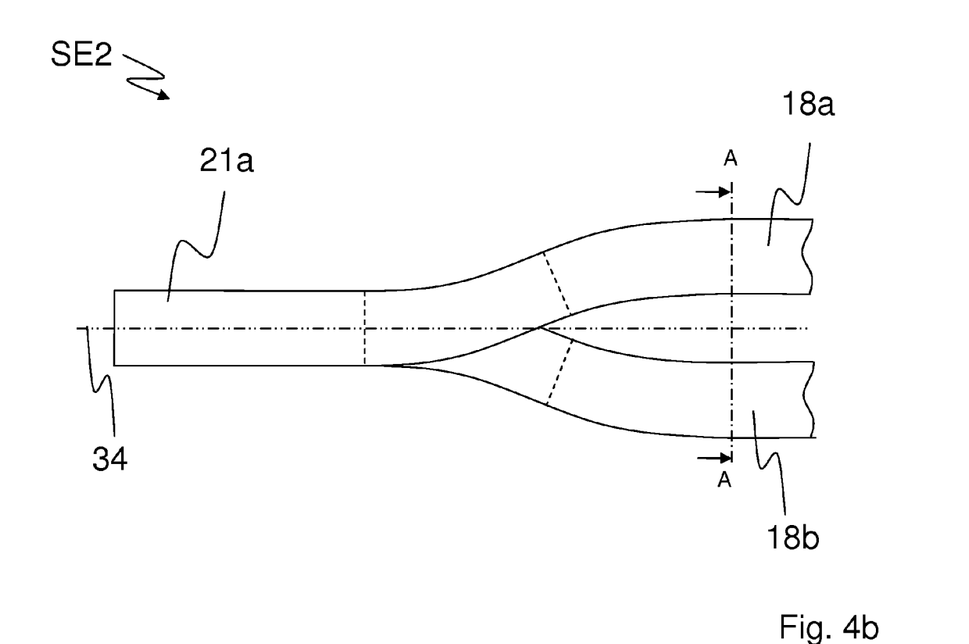

FIG. 4a, 4b show an inventive superconducting element SE2 with deformed HTS-strips 18a, 18b. The HTS strips 18a, 18b are deformed such that they are out of plane 34, which is defined by the end sections 21a, 21b of the superconducting element SE2. The HTS strips 18a, 18b may be kept deformed temporarily for deposition of the shunt layer 17 onto the inner edge surfaces 28a, 28b and then may be returned back to a flat form, as shown in FIG. 1a. Please note that, due to clarity, the first protection layer is not shown in FIG. 4a.

In certain circumstances it is preferred to keep the HTS strips 18a, 18b deformed permanently. This may be important when the substrate tape width is small (say 4 mm). The substrate width is small if it does not exceed the width of the elongated opening by a factor from 20 to 200. In this case, in order not to lose current the cutting prior to deposition of the shunt layer 17 is made very thin (50 µm for example). On the other hand thickness of the basic conductive layer 16 (e.g. Cu layer via galvanic plating) may be equal to 50 µm or even more. Thus the thickness of the shunt layer material deposited on the two inner edge surfaces 28a, 28b exceeds the width $W_{op}$ of the opening. An opening 19 that is smaller than the sum of the thicknesses of the shunt layer material deposited on the two inner edge surfaces 28a, 28b is called "narrow opening." In case of a narrow opening it is advantageous to keep the HTS-strips 18a, 18b deformed permanently. Advantageously the HTS-strips 18a, 18b are bended in different directions such that the plane 34 defined by the end sections 21a, 21b separates the HTS strips 18a, 18b, as shown in FIG. 4b.

Figure 5A:
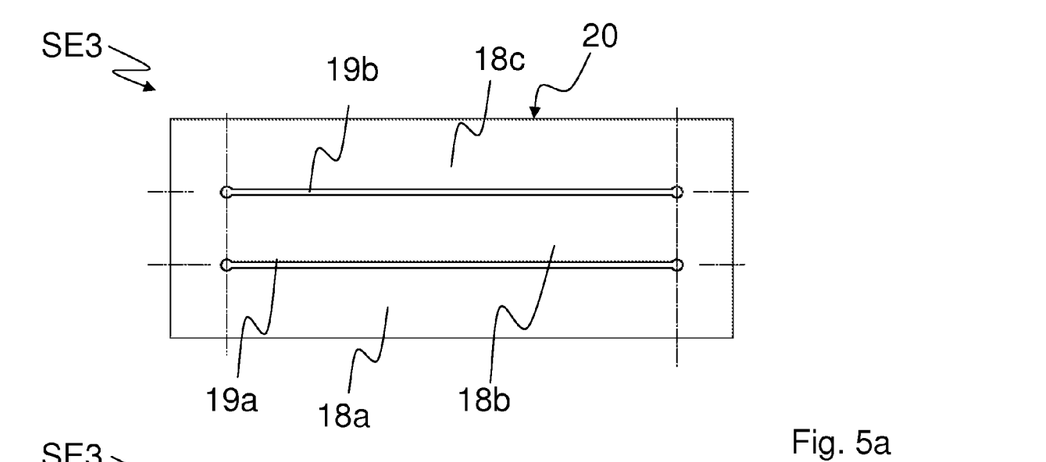
FIG. 5a shows schematically a top view of an inventive superconducting element with two openings.
Figure 5B:
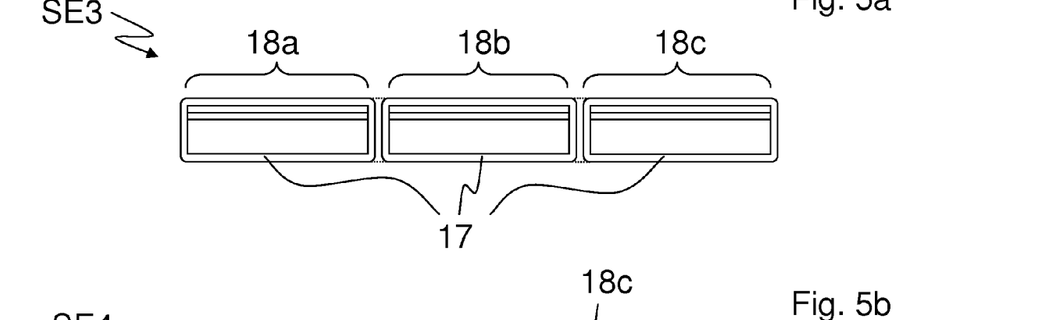
Figure 5C:
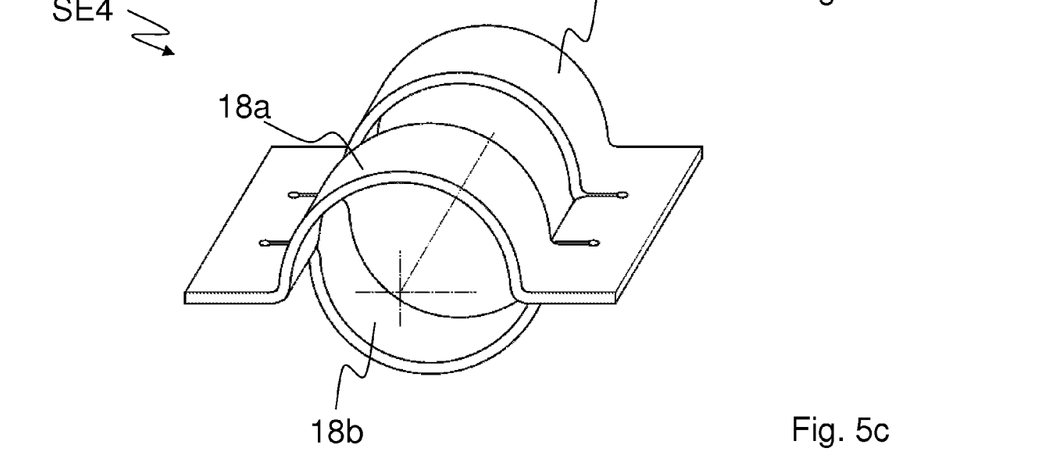
FIG. 5c shows schematically an inventive superconducting element with two openings and deformed HTS-strips.

FIG. 5a shows an inventive superconducting element SE3 with two openings 19a, 19b. The openings 19a, 19b divide the central section 20 of the superconducting element SE3 into three HTS-strips 18a, 18b, 18c. Superconducting elements SE3 with two openings can be used in order to provide a persistent coil consisting of two complimentary coils each of which corresponds to FIG. 5c. This may used not only in magnets but also in iSFCLs FIG. 5b shows a crossectional view of the superconducting element SE3 shown in FIG. 5a. In contrast to the superconducting element SE2 shown in FIG. 4a the openings 19a, 19b of the superconducting element SE3 shown in FIG. 5b are wider than the thickness of the of the shunt layer material deposited on the inner edge surfaces 28a, 28b. Thus the HTS-strips 18a, 18b, 18c may either be returned to a flat form after deposition of the shunt layer 17 as shown in FIG. 5b or can be kept deformed as shown for a superconducting element SE4 in FIG. 5c.

Figure 6A:
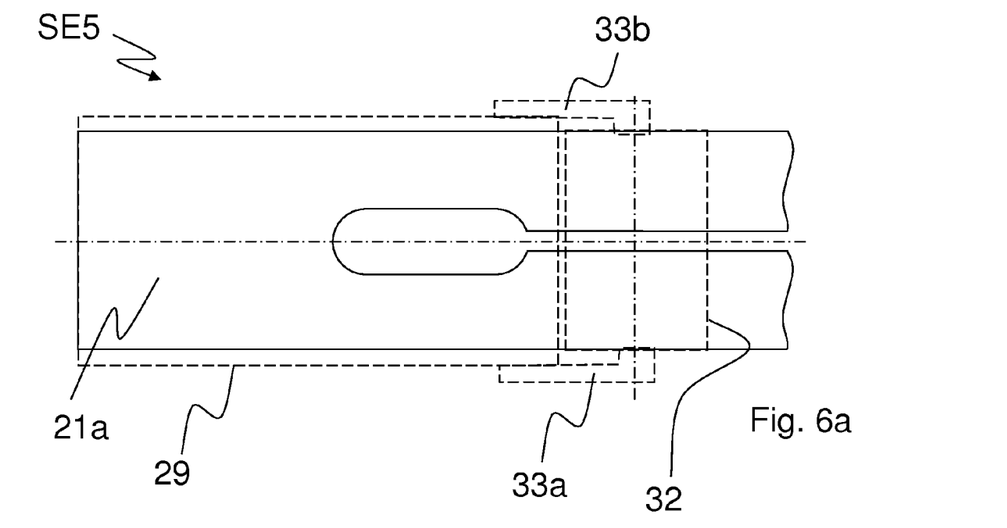
FIG. 6a shows schematically a partial top view of an inventive superconducting element provided with protectors.
Figure 6B:
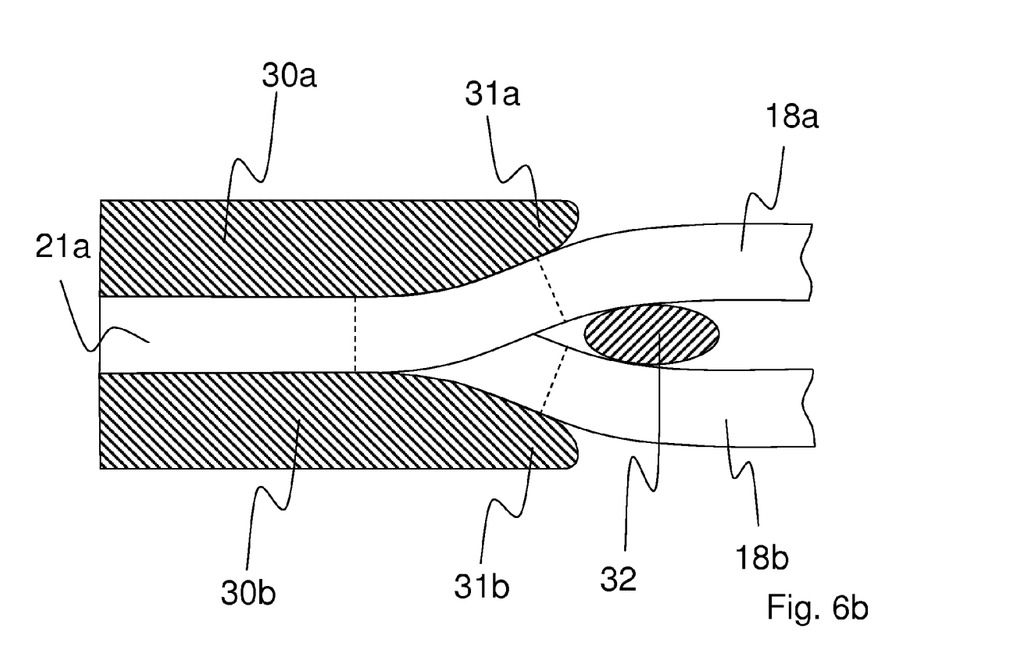

FIG. 6a, 6b show one end section 21a of an inventive superconducting element SE5 which is provided with a protector. In general, both end sections 21a, 21b are provided with protectors.

The protector comprises an outer protection device 29 which covers at least the bottom and the top surface of the end section 21a of the superconducting element SE5. The outer protection device 29 may be a clamp with legs 30a, 30b (U-shaped) for inserting the end section 21a between the legs 30a, 30b of the U shaped clamp. It is also possible to provide separate outer protection elements for the bottom surface and the top surface of the end section 21a, which are fixed to the end section 21a. Preferably the outer protection device 29 is formed as a sleeve, thereby surrounding the whole end section 21a, including the outer side surfaces of the end sections. As shown in FIG. 6b the outer protection device 29 protrudes over the end sections with protrusions 31a, 31b.

The inventive protector may further comprise a spacer 32, which is placed between the deformed HTS-strips 18a, 18b, thereby sustaining the deformation of the HTS-strips 18a, 18b. FIG. 6b shows the spacer 32 which is positioned below HTS-strip 18a and above HTS-strip 18b thereby preventing the HTS-strips 18a, 18b from returning into the flat form and (in case of a narrow opening) from contacting each other. The spacer 32 can be attached to the outer protection device 29 via mechanical connecting elements 33a, 33b, as shown in FIG. 6a.

All embodiments of the inventive superconducting element comprise an opening which divides a central section into several HTS-strips, thereby defining a closed current loop within the superconducting element. The opening is the result of a cutting process which is carried out prior to the deposition of the shunt layer. Thus the shunt layer cannot be damaged during the cutting process. The inventive superconducting element can achieve higher critical currents compared to known superconducting elements. The inventive shunt layer covers all surfaces of the HTS-strips, including the edge surfaces of the opening that resulted from the cutting process, thereby enhancing lifetime and operational stability of the superconducting element.

LIST OF REFERENCE SIGNS 10 substrate
11 buffer layer
12 HTS layer
14 first protection layer
15 second protection layer
16 basic conductive layer
17 shunt layer
18a, 18b, 18c HTS strips
19 opening
20 central section
21a, 21b end sections
22 longitudinal axis of superconducting element (longer axis)
23 dilated area
24 top surface
25a, 25b outer edge surfaces of the partially prepared coated tape 26 bottom surface of the substrate
27 partially prepared coated tape
28a, 28b inner edge surfaces of the partially prepared coated tape=edge surfaces of the opening
29 outer projection device
30a. 30b legs
31a, 31b. protrusion of the outer projection device
32 spacer
33a, 33b connecting elements
34 plane defined by end sections
$L_{end}$ length of the end section
$L_{SE}$ length of the superconducting element
SE, SE' superconducting element
$T_{sub}$ thickness of substrate
$W_{op}$ width of the opening
$W_{SE}$ width of the superconducting element
$W_{strip}$ width of the HTS-strip

I claim:

1. A superconducting element, the element comprising:
a substrate tape, said substrate tape having a first end section with a first upper surface, a second end section having a second upper surface and a central section disposed between said first and said second end sections, said central section having at least one elongated opening dividing said central section into at least a first HTS strip having a first strip upper surface and a second HTS strip having a second strip upper surface;
a buffer layer deposited on said first upper surface, said second upper surface, said first strip upper surface and said second strip upper surface;
a high temperature superconducting (HTS) layer deposited on said buffer layer;
a first protection layer deposited on said HTS layer; and
a shunt layer, said shunt layer enveloping all surfaces of said HTS strips, wherein said shunt layer comprises a basic conductive layer and a second protection layer said second protection layer being provided between said first protection layer and said basic conductive layer.

2. The superconducting element of claim 1, wherein the superconducting element is elongated.

3. The superconducting element of claim 1, wherein, proximate said first and said second end sections of the superconducting element, a width of said elongated opening is increased in a dilated area.

4. The superconducting element of claim 1, wherein at least one of said first and said second end sections has a length in a longitudinal direction of said elongated opening which exceeds a minimal width of each of said first and said second HTS strips.

5. The superconducting element of claim 4, wherein said length exceeds a width of the superconducting element.

6. The superconducting element of claim 1, wherein a ratio R of a thickness of said substrate tape and a width of said elongated opening is in a range of R=0.5 to R=80.

7. The superconducting element of claim 1, wherein said second protection layer at least partially covers said first protection layer and edge surfaces of underlying layers.

8. The superconducting element of claim 1, wherein said second protection layer, taken together with said first protection layer, envelope all surfaces of the superconducting element which are available before deposition of said basic conductive layer.

9. The superconducting element of claim 1, wherein said second protection layer comprises noble metals, copper or alloys thereof.

10. The superconducting element of claim 1, wherein said basic conductive layer comprises noble metals, copper, nickel or alloys thereof.

11. The superconducting element of claim 1, wherein said buffer layer comprises at least two different sub-layers.

12. The superconducting element of claim 1, wherein said HTS layer comprises a high temperature superconductor, $ReBa_2Cu_3O_{7-x}$ or mixtures thereof, wherein Re denotes a rare earth element.

13. The superconducting element of claim 1, wherein said first and said second end sections comprise a protector for limiting bending and torsion of said first and said second HTS strips.

14. The superconducting element of claim 13, wherein said protector projects above said first and said second end sections in a longitudinal direction thereof.

15. The superconducting element of claim 1, wherein said first and said second HTS strips are mechanically deformed, twisted or bent.

16. A superconducting coil comprising the super-conducting element of claim 1.

17. A method for manufacturing the high temperature superconducting element of claim 1, the method comprising the steps of:
a) providing a substrate tape;
b) depositing a buffer layer onto the substrate tape;
c) depositing an HTS layer onto the buffer layer;
d) depositing a first protection layer onto the HTS layer;
e) cutting, following step d), the element, thereby dividing a central part of partially prepared coated tape into at least two HTS strips; and
f) depositing, following step e), a shunt layer onto all surfaces of each of the HTS strips of the partially prepared coated tape.

18. The method of claim 17, wherein during step f), the HTS strips are tilted relative to each other, thereby keeping the partially prepared coated tape.

* * * * *